United States Patent
Burmeister

(10) Patent No.: US 6,827,502 B2
(45) Date of Patent: Dec. 7, 2004

(54) TWIN VCSEL ARRAY FOR SEPARATE MONITORING AND COUPLING OF OPTICAL POWER INTO FIBER IN AN OPTICAL SUBASSEMBLY

(75) Inventor: Stefan J. Burmeister, San Francisco, CA (US)

(73) Assignee: Infineon Technologies AG, Munich (DE)

( * ) Notice: Subject to any disclaimer, the term of this patent is extended or adjusted under 35 U.S.C. 154(b) by 300 days.

(21) Appl. No.: 09/800,543

(22) Filed: Mar. 6, 2001

(65) Prior Publication Data

US 2002/0126963 A1 Sep. 12, 2002

(51) Int. Cl.[7] .............................. G02B 6/36; H01S 3/13
(52) U.S. Cl. ...................... 385/88; 385/92; 372/29.014; 372/29.021
(58) Field of Search .............................. 385/15, 27, 31, 385/88, 92; 372/29.011, 29.014, 29.015, 29.021, 31, 33, 38.01, 96

(56) References Cited

U.S. PATENT DOCUMENTS

| | | | | |
|---|---|---|---|---|
| 5,191,204 A | * | 3/1993 | Dickson et al. .......... | 250/208.2 |
| 5,757,829 A | * | 5/1998 | Jiang et al. .................... | 372/31 |
| 5,812,582 A | * | 9/1998 | Gilliland et al. .............. | 372/50 |
| 5,905,750 A | * | 5/1999 | Lebby et al. .................. | 372/50 |

OTHER PUBLICATIONS

"Honeywell VCSEL Technology", Honeywell Inc.
Emcore "VCSEL Components Arrays And Subassemblies".
"Broadband LED's", Caswell Limited.

* cited by examiner

Primary Examiner—Edward J. Glick
Assistant Examiner—Chih-Cheng Glen Kao
(74) Attorney, Agent, or Firm—Fish & Richardson P.C.

(57) ABSTRACT

The present invention provides a two VCSEL array mounted in a single can with a monitoring diode. One VCSEL is directed toward the can window (for coupling with an attached fiber optic in a completed subassembly) and the other is directed toward the monitor diode. The two VCSELS are electrically coupled in parallel, are connected to the same pins in the TO can, and are driven by the same source. Preferably the two VCSELS are identical or nearly identical. The current of the monitor diode is proportional to the light emitted by both VCSELs. Since the monitor diode measures incident light from the second VCSEL, no angle of reflection is affected by changes in temperature. Since the two VCSELs are coupled in parallel, the device has a naturally low impedance.

25 Claims, 2 Drawing Sheets

TWIN VCSEL ARRAY FOR SEPARATE MONITORING AND COUPLING OF OPTICAL POWER INTO FIBER IN AN OPTICAL SUBASSEMBLY

BACKGROUND OF THE INVENTION

1. Field of the Invention

The invention relates generally to Vertical Cavity Surface Emitting Lasers (VCSELs) used, for example, in data communications applications. More particularly, the invention relates to apparatus; methods for operating; and methods for fabricating an optical subassembly containing a VCSEL array, for coupling optical power from a first VCSEL in the array into a fiber and separately monitoring optical power output by the first VCSEL.

According to a preferred embodiment of the invention the separate monitoring function is performed using the combination of a second VCSEL, coupled in parallel to the first VCSEL using a common power source; and monitoring means that operate independent of the angle of reflected light originating from the first VCSEL and the affects of temperature thereon.

2. Brief Description of the Prior Art

VCSEL stands for Vertical Cavity Surface Emitting Laser, a relatively new kind of semiconductor laser that is having a dramatic influence in computing and networking, sensing, and other applications. VCSELs combine the performance advantages of LEDs and CD lasers at costs comparable to LED solutions.

Traditional semiconductor lasers, like those used in CD players, emit light from the edge of the chip, so it is necessary to cleave a wafer into chips and package the chip before knowing if the laser is good.

VCSELs emit light vertically from the wafer surface, like LEDs, which means their fabrication and testing is fully compatible with standard I.C. procedures and equipment. Moreover, VCSELs are much faster, more efficient, and produce a smaller divergence beam than LEDs.

As indicated hereinabove, VCSELs are useful in data communications applications, telecommunications systems and products (for example, optical transcievers), etc.

An illustrative VCSEL component used in fiber optic communications (shown as component 1 in prior art FIG. 1), may be packaged in a "TO-46 can" (such as can 2) having a window 3 which may or may not include a lens. A back monitor photodiode 4 is shown in FIG. 1 mounted inside the can with the VCSEL (VCSEL 5).

The photodiode 4 illustrated typically would be, for example, a power monitor diode which can be used with appropriate feedback control circuitry to set a maximum power level for the VCSEL, simplifying design for high data rate communication and eye safety. Photodiode 4 receives light that is emitted from VCSEL 5 and reflected off the interior of can 2, as illustrated via reflected light beam 6 in FIG. 1.

The placement of the monitor diode has two disadvantages. First, it is sensitive to changes in temperature as the angle of reflected light inside the can changes with temperature. This results in erroneous power measurements since the light received by the monitor diode can change even if the optical power emitted by the VCSEL remains the same.

Second, the diode raises the impedance of the VCSEL device. This requires the addition of a parallel resistor to lower the device impedance.

SUMMARY OF THE INVENTION

It is therefore an object of the invention to provide a VCSEL device which overcomes the disadvantages of the prior art VCSEL devices.

It is also an object of the invention to provide a VCSEL device which is particularly well suited to coupling with a fiber optic.

It is another object of the invention to provide a VCSEL device which has a low impedance.

It is still another object of the invention to provide a VCSEL device with a monitoring diode which operates independent of the angle of reflected light (which may, for example, be affected by temperature) originating from the VCSEL outputting a data stream.

In accord with these objects which will be discussed in detail below, one embodiment of present invention provides for a twin VCSEL array mounted in a single can with a monitoring diode. One VCSEL is directed toward the can window (for coupling with an attached fiber optic in a completed subassembly) and the other is directed toward the monitor diode. The two VCSELS are electrically coupled in parallel, are connected to the same pins in the TO can, and are driven by the same source.

An alternate embodiment of the invention contemplates a similar assembly as described hereinabove, with the fiber being directly coupled to the VCSEL outputting the optical data stream (as opposed to the VCSEL having its output directed at the monitoring diode).

According to a preferred embodiment of the invention the two VCSELS are identical or nearly identical.

Further, according to a preferred embodiment of the invention, the current of the monitor diode is proportional to the light emitted by both VCSELs.

Those skilled in the art will readily appreciate that the VCSEL having its output directed toward the monitoring diode could be designed (for example) to output, for example, 50%, 75% or some other percentage (or multiple) of the optical power of VCSEL having its output directed at the window (outputting the data stream) to signify proper operation of the VCSEL outputting the data stream. All such designs are contemplated by the instant invention.

In accord with the objects of the invention, since the monitor diode measures incident light from the second VCSEL, no angle of reflection is affected by changes in temperature or other parameters (like the surface of the TO can, mechanical stresses, etc.), that can affect monitored power if the reflection technique of the prior art were being used.

Further, since the two VCSELs are coupled in parallel, the device has a naturally low impedance.

A further embodiment of the invention may be characterized as the combination of a VCSEL array, including a first VCSEL and a second VCSEL coupled in parallel therewith, with means for monitoring the optical power output by said second VCSEL.

According to a yet another aspect of thereof, the invention may be characterized as apparatus for coupling optical power into a fiber and separately monitoring optical power comprising means for outputting an optical data stream; and means for monitoring the optical power output by the means for outputting, independent of the angle of reflected light originating from the means for outputting the data stream and the affects of temperature thereon.

A still further aspect of the invention is directed to methods for fabricating a device capable of coupling optical power into a fiber and separately monitoring optical power independent of the angle of reflected light originating from a VCSEL and the affects of temperature thereon, comprising the steps of forming a VCSEL array by coupling in parallel a first VCSEL and a second VCSEL connected to the same power source; and mounting the VCSEL array and means for monitoring optical power output by the second VCSEL in a TO can.

Further still, the invention contemplates methods for coupling optical power into a fiber and separately monitoring optical power, comprising the steps of coupling in parallel a first VCSEL and a second VCSEL (connected to the same power source); generating, via said the VCSEL, an optical data stream; and monitoring the optical power output of the second VCSEL to provide an indication of the optical power output by the first VCSEL coupled in parallel therewith.

Additional objects and advantages of the invention will become apparent to those skilled in the art upon reference to the detailed description taken in conjunction with the provided figures.

DETAILED DESCRIPTION

Figure 1:
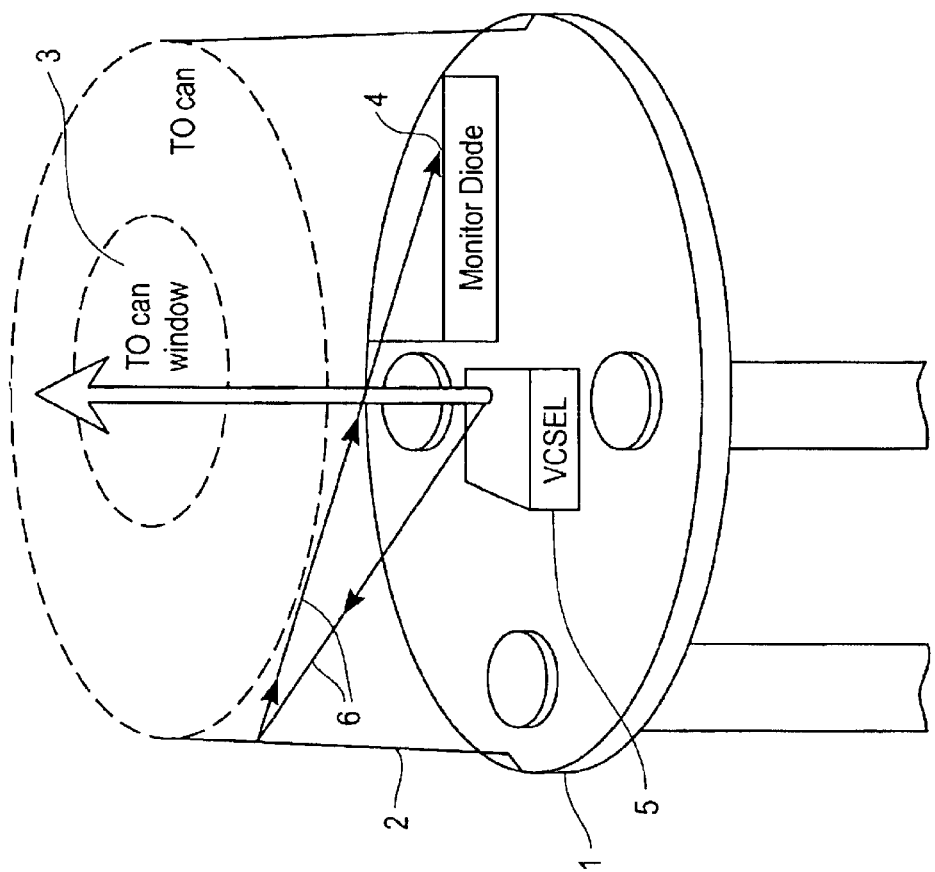
FIG. 1 is a schematic illustration of a prior art VCSEL component.
Figure 2:
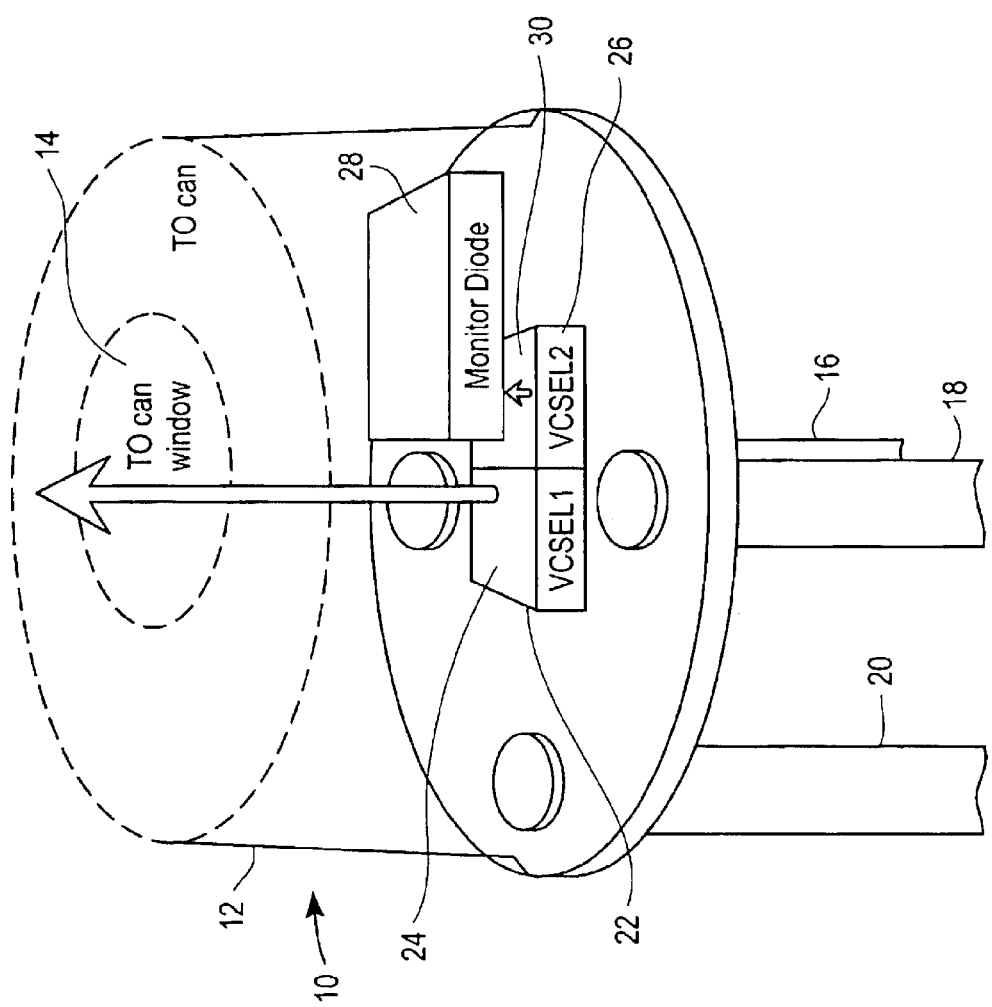
FIG. 2 is a schematic illustration of the invention.

Referring now to FIG. 2, the VCSEL component 10 of the present invention includes a component can 12 having an optical window 14 and three electrical leads 16, 18, and 20. A first VCSEL 22 is mounted inside the can with its light emitting surface 24 directed toward the window 14. A second VCSEL 26 is mounted inside the can 12 alongside the first VCSEL 22 and a monitor diode 28 is mounted above the light emitting surface 30 of the second VCSEL 26.

According to a presently preferred embodiment, the two VCSELs are identical or nearly identical and are coupled to each other in parallel. One of the leads, e.g. 16 is common and is connected to the VCSELs and to the diode 28. One of the other leads, e.g. 18 is coupled to the VCSELs for driving them and the third lead, e.g. 20, is coupled to the diode for measuring current from the diode.

The current of the monitor diode 28 is proportional to the light emitted by the second VCSEL which is identical to or nearly identical to the light emitted by the first VCSEL. Since the monitor diode measures incident light from the second VCSEL, no angle of reflection is affected by changes in temperature. Since the two VCSELs are coupled in parallel, the device has a naturally low impedance.

There has been described and illustrated herein a VCSEL component. While particular embodiments of the invention have been described, it is not intended that the invention be limited thereto, as it is intended that the invention be as broad in scope as the art will allow and that the specification be read likewise.

It will therefore be appreciated by those skilled in the art that yet other modifications could be made to the provided invention without deviating from its spirit and scope as so claimed.

What is claimed is:

1. Apparatus for coupling light into a fiber and separately monitoring optical power, comprising:
   (a) a Vertical Cavity Surface Emitting Laser ("VCSEL") array including exactly one first VCSEL providing light directed into the fiber and having a first optical power output and exactly one second VCSEL coupled in parallel therewith, the second VCSEL having a second optical power output that is proportional to but substantially different from the first optical power output of the first VCSEL; and
   (b) means for monitoring the second optical power output of said second VCSEL to provide an indication of the first optical power output.

2. Apparatus as set forth in claim 1 wherein said VCSEL array and said means for monitoring are both mounted in a TO can.

3. Apparatus as set forth in claim 2 wherein said TO can includes an optical window through which light output by said first VCSEL may pass.

4. Apparatus as set forth in claim 2 wherein said TO can further includes a plurality of electrical connection pins.

5. Apparatus as set forth in claim 4 wherein said first VCSEL is coupled to the same electrical pins as said second VCSEL.

6. Apparatus as set forth in claim 1 wherein said first VCSEL and said second VCSEL are both driven by the same power source.

7. Apparatus as set forth in claim 1 wherein said monitoring means is a monitoring diode.

8. Apparatus as set forth in claim 7 wherein current of said monitoring diode is proportional to light emitted by said second VCSEL.

9. Apparatus as set forth in claim 1 wherein said first VCSEL generates an optical data stream.

10. Apparatus as set forth in claim 1, wherein the second optical power output is a percentage of the first optical power output.

11. Apparatus as set forth in claim 10, wherein the second optical power output is about fifty percent or about seventy five percent of the first optical power output.

12. Apparatus as set forth in claim 1, wherein the second optical power output is a multiple of the first optical power output.

13. A Vertical Cavity Surface Emitting Laser ("VCSEL") component for driving a fiber optic, comprising:
   (a) a can having an optical window for coupling optical power into said fiber optic;
   (b) exactly one first VCSEL mounted in said can, the first VCSEL providing light directed toward said optical window and having a first optical power output;
   (c) a monitoring diode mounted in said can; and
   (d) exactly one second VCSEL mounted in said can, the second VCSEL providing light directed toward said monitoring diode and having a second optical power output that is proportional to but substantially different from the first optical power output.

14. A VCSEL component according to claim 13 wherein said first VCSEL and said second VCSEL are electrically coupled in parallel.

15. A VCSEL component according to claim 14 wherein said can has a plurality of electrical connection pins and said first VCSEL is coupled to the same pins as said second VCSEL.

16. A VCSEL component according to claim 13, wherein the second optical power output is a percentage of the first optical power output.

17. Apparatus as set forth in claim 16, wherein the second optical power output is about fifty percent or about seventy five percent of the first optical power output.

18. A VCSEL component according to claim 13, wherein the second optical power output is a multiple of the first optical power output.

19. A method for fabricating a device capable of coupling light into a fiber and separately monitoring optical power, comprising steps of:

(a) forming a Vertical Cavity Surface Emitting Laser ("VCSEL") array by coupling in parallel exactly one first VCSEL and exactly one second VCSEL connected to the same power source, the first VCSEL outputting light and having a first optical power output, the second VCSEL having a second optical power output that is proportional to but substantially different from the first optical power output; and (b) mounting said VCSEL array and means for monitoring optical power output of said second VCSEL in a TO can.

20. A method as set forth in claim 19 further comprising the step of forming an optical window in said TO can through which light output by said first VCSEL may pass.

21. A method as set forth in claim 19 further comprising the step of attaching a fiber to said first VCSEL.

22. A method as set forth in clam 19 further comprising the step of coupling said first VCSEL and said second VCSEL to the same electrical pins in said TO can.

23. A method for coupling optical data into a fiber and separately monitoring optical power, comprising the steps of:

(a) coupling in parallel exactly one first Vertical Cavity Surface Emitting Laser ("VCSEL") and exactly one second VCSEL connected to the same power source, the first VCSEL having a first optical power output and the second VCSEL having a second optical power output that is proportional to but substantially different from the first optical power output;

(b) generating, via said first VCSEL, an optical data stream; and (c) monitoring the second optical power output of said second VCSEL to provide an indication of the first optical power output of said first VCSEL coupled in parallel therewith.

24. A method as set forth in claim 23 further comprising the step of mounting the VCSEL array formed by coupling said first VCSEL and said second VCSEL, together with means for monitoring the optical power output of said second VCSEL, in a TO can.

25. A method for coupling optical data into a fiber and separately monitoring optical power, comprising the steps of:

(a) outputting an optical data stream utilizing exactly one first Vertical Cavity Surface Emitting Laser ("VCSEL") having a first optical power output; and (b) monitoring the first optical power output of said first VCSEL by separately monitoring a second optical power output of exactly one second VCSEL coupled in parallel therewith, the second optical power output being proportional to but substantially different from the first optical power output.

\* \* \* \* \*